(12) United States Patent
Ponce et al.

(10) Patent No.: US 9,400,617 B2
(45) Date of Patent: Jul. 26, 2016

(54) HARDWARE-ASSISTED DMA TRANSFER WITH DEPENDENCY TABLE CONFIGURED TO PERMIT-IN PARALLEL-DATA DRAIN FROM CACHE WITHOUT PROCESSOR INTERVENTION WHEN FILLED OR DRAINED

(71) Applicants: Cyrill Ponce, Malabon (PH); Marizonne Operio Fuentes, Leyte (PH); Gianico Geonzon Noble, Laguna (PH)

(72) Inventors: Cyrill Ponce, Malabon (PH); Marizonne Operio Fuentes, Leyte (PH); Gianico Geonzon Noble, Laguna (PH)

(73) Assignee: BiTMICRO Networks, Inc., Fremont, CA (US)

( * ) Notice: Subject to any disclaimer, the term of this patent is extended or adjusted under 35 U.S.C. 154(b) by 0 days.

(21) Appl. No.: 14/217,467

(22) Filed: Mar. 17, 2014

(65) Prior Publication Data

US 2015/0006766 A1    Jan. 1, 2015

Related U.S. Application Data

(60) Provisional application No. 61/802,367, filed on Mar. 15, 2013.

(51) Int. Cl.
*G06F 3/00* (2006.01)
*G06F 3/06* (2006.01)
*G06F 12/08* (2016.01)

(52) U.S. Cl.
CPC ............ *G06F 3/0683* (2013.01); *G06F 3/061* (2013.01); *G06F 3/0656* (2013.01); *G06F 12/08* (2013.01)

(58) Field of Classification Search
USPC ................................................... 710/22, 308
See application file for complete search history.

(56) References Cited

U.S. PATENT DOCUMENTS

| 4,752,871 | A | 6/1988 | Sparks |
| 5,111,058 | A | 5/1992 | Martin |

(Continued)

FOREIGN PATENT DOCUMENTS

| JP | 2005142859 A | 6/2005 |
| JP | 2005-309847 | 11/2005 |

(Continued)

OTHER PUBLICATIONS

Office Action for U.S. Appl. No. 13/253,912 mailed on Jul. 16, 2014.

(Continued)

*Primary Examiner* — Tammara Peyton

(57) ABSTRACT

The invention provides the data flow communication control between the source (flash/IO) and destination (IO/flash) cores. The source and destination cores are started simultaneously instead of serially and get instructions from the descriptors provided and set-up by the processor. Each source and destination core's descriptors[1] are correlated or tied with each other by the processor by providing information to the hardware assist mechanism. The hardware assist mechanism responsible for moderating the data transfer from source to destination. The flow tracker guarantees that data needed by destination exists.

[1] Descriptors are set of instructions that is used to activate the DMA controller.

By applying the invention to the prior approach/solution, the data latency between the flash & IO bus will be reduced. Processor interrupts will be minimized while data transfer between the flash & IO bus is ongoing.

17 Claims, 10 Drawing Sheets

(56) References Cited

U.S. PATENT DOCUMENTS

| | | |
|---|---|---|
| RE34,100 E | 10/1992 | Hartness |
| 5,222,046 A | 6/1993 | Kreifels et al. |
| 5,297,148 A | 3/1994 | Harari et al. |
| 5,341,339 A | 8/1994 | Wells |
| 5,371,709 A | 12/1994 | Fisher et al. |
| 5,379,401 A | 1/1995 | Robinson et al. |
| 5,388,083 A | 2/1995 | Assar et al. |
| 5,396,468 A | 3/1995 | Harari et al. |
| 5,406,529 A | 4/1995 | Asano |
| 5,432,748 A | 7/1995 | Hsu et al. |
| 5,448,577 A | 9/1995 | Wells et al. |
| 5,459,850 A | 10/1995 | Clay et al. |
| 5,479,638 A | 12/1995 | Assar et al. |
| 5,485,595 A | 1/1996 | Assar et al. |
| 5,488,711 A | 1/1996 | Hewitt et al. |
| 5,500,826 A | 3/1996 | Hsu et al. |
| 5,509,134 A | 4/1996 | Fandrich et al. |
| 5,513,138 A | 4/1996 | Manabe et al. |
| 5,524,231 A | 6/1996 | Brown |
| 5,530,828 A | 6/1996 | Kaki et al. |
| 5,535,328 A | 7/1996 | Harari et al. |
| 5,535,356 A | 7/1996 | Kim et al. |
| 5,542,042 A | 7/1996 | Manson |
| 5,542,082 A | 7/1996 | Solhjell |
| 5,548,741 A | 8/1996 | Watanabe |
| 5,559,956 A | 9/1996 | Sukegawa |
| 5,568,423 A | 10/1996 | Jou et al. |
| 5,568,439 A | 10/1996 | Harari |
| 5,572,466 A | 11/1996 | Sukegawa |
| 5,594,883 A | 1/1997 | Pricer |
| 5,602,987 A | 2/1997 | Harari et al. |
| 5,603,001 A | 2/1997 | Sukegawa et al. |
| 5,606,529 A | 2/1997 | Honma et al. |
| 5,606,532 A | 2/1997 | Lambrache et al. |
| 5,619,470 A | 4/1997 | Fukumoto |
| 5,627,783 A | 5/1997 | Miyauchi |
| 5,640,349 A | 6/1997 | Kakinuma et al. |
| 5,644,784 A | 7/1997 | Peek |
| 5,682,509 A | 10/1997 | Kabenjian |
| 5,737,742 A | 4/1998 | Achiwa et al. |
| 5,787,466 A | 7/1998 | Berliner |
| 5,796,182 A | 8/1998 | Martin |
| 5,799,200 A | 8/1998 | Brant et al. |
| 5,802,554 A | 9/1998 | Caceres et al. |
| 5,819,307 A | 10/1998 | Iwamoto et al. |
| 5,822,251 A | 10/1998 | Bruce et al. |
| 5,875,351 A | 2/1999 | Riley |
| 5,881,264 A | 3/1999 | Kurosawa |
| 5,913,215 A | 6/1999 | Rubinstein et al. |
| 5,918,033 A | 6/1999 | Heeb et al. |
| 5,943,421 A | 8/1999 | Grabon |
| 5,956,743 A | 9/1999 | Bruce et al. |
| 6,000,006 A | 12/1999 | Bruce et al. |
| 6,014,709 A | 1/2000 | Gulick et al. |
| 6,076,137 A | 6/2000 | Asnaashari |
| 6,098,119 A | 8/2000 | Surugucchi et al. |
| 6,128,303 A | 10/2000 | Bergantino |
| 6,215,875 B1 | 4/2001 | Nohda |
| 6,230,269 B1 | 5/2001 | Spies et al. |
| 6,298,071 B1 | 10/2001 | Taylor et al. |
| 6,363,441 B1 | 3/2002 | Beniz et al. |
| 6,363,444 B1 | 3/2002 | Platko et al. |
| 6,397,267 B1 | 5/2002 | Chong, Jr. |
| 6,404,772 B1 | 6/2002 | Beach et al. |
| 6,496,939 B2 | 12/2002 | Portman et al. |
| 6,526,506 B1 | 2/2003 | Lewis |
| 6,529,416 B2 | 3/2003 | Bruce et al. |
| 6,557,095 B1 | 4/2003 | Henstrom |
| 6,744,635 B2 | 6/2004 | Portman et al. |
| 6,757,845 B2 | 6/2004 | Bruce |
| 6,857,076 B1 | 2/2005 | Klein |
| 6,901,499 B2 | 5/2005 | Aasheim et al. |
| 6,922,391 B1 | 7/2005 | King et al. |
| 6,961,805 B2 | 11/2005 | Lakhani et al. |
| 6,970,446 B2 | 11/2005 | Krischar et al. |
| 6,970,890 B1 | 11/2005 | Bruce et al. |
| 6,980,795 B1 | 12/2005 | Hermann et al. |
| 7,103,684 B2 | 9/2006 | Chen et al. |
| 7,174,438 B2 | 2/2007 | Homma et al. |
| 7,194,766 B2 | 3/2007 | Noehring et al. |
| 7,263,006 B2 | 8/2007 | Aritome |
| 7,283,629 B2 | 10/2007 | Kaler et al. |
| 7,305,548 B2 | 12/2007 | Pierce et al. |
| 7,330,954 B2 | 2/2008 | Nangle |
| 7,372,962 B2 | 5/2008 | Fujimoto et al. |
| 7,386,662 B1 | 6/2008 | Kekre et al. |
| 7,430,650 B1 | 9/2008 | Ross |
| 7,490,177 B2 * | 2/2009 | Kao .............................. 710/22 |
| 7,500,063 B2 | 3/2009 | Zohar et al. |
| 7,506,098 B2 | 3/2009 | Arcedera et al. |
| 7,613,876 B2 | 11/2009 | Bruce et al. |
| 7,620,748 B1 | 11/2009 | Bruce et al. |
| 7,624,239 B2 | 11/2009 | Bennett et al. |
| 7,636,801 B1 | 12/2009 | Kekre et al. |
| 7,660,941 B2 | 2/2010 | Lee et al. |
| 7,676,640 B2 | 3/2010 | Chow |
| 7,681,188 B1 | 3/2010 | Tirumalai et al. |
| 7,716,389 B1 | 5/2010 | Bruce et al. |
| 7,729,730 B2 | 6/2010 | Zuo et al. |
| 7,743,202 B2 | 6/2010 | Tsai et al. |
| 7,765,359 B2 | 7/2010 | Kang et al. |
| 7,877,639 B2 | 1/2011 | Hoang |
| 7,913,073 B2 | 3/2011 | Choi |
| 7,921,237 B1 | 4/2011 | Holland et al. |
| 7,934,052 B2 | 4/2011 | Prins et al. |
| 8,010,740 B2 | 8/2011 | Arcedera et al. |
| 8,032,700 B2 | 10/2011 | Bruce et al. |
| 8,156,320 B2 | 4/2012 | Borras |
| 8,161,223 B1 | 4/2012 | Chamseddine et al. |
| 8,165,301 B1 | 4/2012 | Bruce et al. |
| 8,200,879 B1 | 6/2012 | Falik et al. |
| 8,341,311 B1 * | 12/2012 | Szewerenko ............ G06F 13/28 710/22 |
| 8,375,257 B2 | 2/2013 | Hong et al. |
| 8,447,908 B2 | 5/2013 | Bruce et al. |
| 8,510,631 B2 | 8/2013 | Wu et al. |
| 8,560,804 B2 | 10/2013 | Bruce et al. |
| 8,707,134 B2 | 4/2014 | Takahashi et al. |
| 8,713,417 B2 | 4/2014 | Jo |
| 8,788,725 B2 | 7/2014 | Bruce et al. |
| 8,959,307 B1 | 2/2015 | Bruce et al. |
| 9,043,669 B1 | 5/2015 | Bruce et al. |
| 9,099,187 B2 | 8/2015 | Bruce et al. |
| 9,135,190 B1 | 9/2015 | Bruce et al. |
| 9,147,500 B2 | 9/2015 | Kim et al. |
| 2001/0010066 A1 | 7/2001 | Chin et al. |
| 2002/0073324 A1 | 6/2002 | Hsu et al. |
| 2002/0083262 A1 | 6/2002 | Fukuzumi |
| 2002/0141244 A1 | 10/2002 | Bruce et al. |
| 2003/0023817 A1 | 1/2003 | Rowlands et al. |
| 2003/0065836 A1 | 4/2003 | Pecone |
| 2003/0120864 A1 | 6/2003 | Lee et al. |
| 2003/0131201 A1 | 7/2003 | Khare et al. |
| 2003/0163624 A1 | 8/2003 | Matsui et al. |
| 2003/0163647 A1 | 8/2003 | Cameron et al. |
| 2003/0163649 A1 | 8/2003 | Kapur et al. |
| 2003/0182576 A1 | 9/2003 | Morlang et al. |
| 2003/0204675 A1 | 10/2003 | Dover et al. |
| 2003/0223585 A1 | 12/2003 | Tardo et al. |
| 2004/0073721 A1 | 4/2004 | Goff et al. |
| 2004/0128553 A1 | 7/2004 | Buer et al. |
| 2005/0120146 A1 | 6/2005 | Chen et al. |
| 2005/0210149 A1 | 9/2005 | Kimball |
| 2005/0243610 A1 | 11/2005 | Guha et al. |
| 2006/0004957 A1 | 1/2006 | Hand, III et al. |
| 2006/0031450 A1 | 2/2006 | Unrau et al. |
| 2006/0095709 A1 | 5/2006 | Achiwa |
| 2006/0112251 A1 | 5/2006 | Karr et al. |
| 2006/0184723 A1 | 8/2006 | Sinclair et al. |
| 2007/0019573 A1 | 1/2007 | Nishimura |
| 2007/0028040 A1 | 2/2007 | Sinclair |
| 2007/0058478 A1 | 3/2007 | Murayama |
| 2007/0073922 A1 | 3/2007 | Go et al. |
| 2007/0083680 A1 | 4/2007 | King et al. |

(56) References Cited

U.S. PATENT DOCUMENTS

| | | |
|---|---|---|
| 2007/0088864 A1 | 4/2007 | Foster |
| 2007/0094450 A1 | 4/2007 | VanderWiel |
| 2007/0096785 A1 | 5/2007 | Maeda |
| 2007/0121499 A1 | 5/2007 | Pal et al. |
| 2007/0130439 A1 | 6/2007 | Andersson et al. |
| 2007/0159885 A1 | 7/2007 | Gorobets |
| 2007/0168754 A1 | 7/2007 | Zohar et al. |
| 2007/0174493 A1 | 7/2007 | Irish et al. |
| 2007/0174506 A1 | 7/2007 | Tsuruta |
| 2007/0195957 A1 | 8/2007 | Arulambalam et al. |
| 2007/0288686 A1 | 12/2007 | Arcedera et al. |
| 2007/0288692 A1 | 12/2007 | Bruce et al. |
| 2008/0052456 A1 | 2/2008 | Ash et al. |
| 2008/0072031 A1 | 3/2008 | Choi |
| 2008/0147963 A1 | 6/2008 | Tsai et al. |
| 2008/0189466 A1 | 8/2008 | Hemmi |
| 2008/0218230 A1 | 9/2008 | Shim |
| 2008/0228959 A1 | 9/2008 | Wang |
| 2009/0055573 A1 | 2/2009 | Ito |
| 2009/0077306 A1 | 3/2009 | Arcedera et al. |
| 2009/0083022 A1 | 3/2009 | Bin Mohd Nordin et al. |
| 2009/0094411 A1 | 4/2009 | Que |
| 2009/0158085 A1 | 6/2009 | Kern et al. |
| 2009/0172250 A1 | 7/2009 | Allen et al. |
| 2009/0172466 A1 | 7/2009 | Royer et al. |
| 2009/0240873 A1 | 9/2009 | Yu et al. |
| 2010/0058045 A1 | 3/2010 | Borras et al. |
| 2010/0095053 A1 | 4/2010 | Bruce et al. |
| 2010/0125695 A1 | 5/2010 | Wu et al. |
| 2010/0250806 A1 | 9/2010 | Devilla et al. |
| 2011/0022778 A1 | 1/2011 | Schibilla et al. |
| 2011/0022801 A1 | 1/2011 | Flynn |
| 2011/0087833 A1 | 4/2011 | Jones |
| 2011/0093648 A1 | 4/2011 | Belluomini et al. |
| 2011/0113186 A1 | 5/2011 | Bruce et al. |
| 2011/0145479 A1 | 6/2011 | Talagala et al. |
| 2011/0161568 A1 | 6/2011 | Bruce et al. |
| 2011/0167204 A1 | 7/2011 | Estakhri et al. |
| 2011/0197011 A1 | 8/2011 | Suzuki et al. |
| 2011/0202709 A1 | 8/2011 | Rychlik |
| 2011/0258405 A1 | 10/2011 | Asaki et al. |
| 2011/0264884 A1 | 10/2011 | Kim |
| 2011/0264949 A1 | 10/2011 | Ikeuchi et al. |
| 2011/0270979 A1 | 11/2011 | Schlansker et al. |
| 2012/0005405 A1 | 1/2012 | Wu et al. |
| 2012/0005410 A1 | 1/2012 | Ikeuchi |
| 2012/0017037 A1 | 1/2012 | Riddle et al. |
| 2012/0102263 A1 | 4/2012 | Aswadhati |
| 2012/0102268 A1 | 4/2012 | Smith et al. |
| 2012/0137050 A1 | 5/2012 | Wang et al. |
| 2012/0271967 A1 | 10/2012 | Hirschman |
| 2012/0311197 A1 | 12/2012 | Larson et al. |
| 2013/0094312 A1 | 4/2013 | Jang et al. |
| 2013/0099838 A1 | 4/2013 | Kim et al. |
| 2013/0111135 A1 | 5/2013 | Bell, Jr. et al. |
| 2013/0208546 A1 | 8/2013 | Kim et al. |
| 2013/0212337 A1 | 8/2013 | Maruyama |
| 2013/0212349 A1 | 8/2013 | Maruyama |
| 2013/0246694 A1 | 9/2013 | Bruce et al. |
| 2013/0262750 A1 | 10/2013 | Yamasaki et al. |
| 2013/0304775 A1 | 11/2013 | Davis et al. |
| 2013/0339578 A1 | 12/2013 | Ohya et al. |
| 2013/0339582 A1 | 12/2013 | Olbrich et al. |
| 2013/0346672 A1 | 12/2013 | Sengupta et al. |
| 2014/0095803 A1 | 4/2014 | Kim et al. |
| 2014/0104949 A1 | 4/2014 | Bruce et al. |
| 2014/0189203 A1 | 7/2014 | Suzuki et al. |
| 2014/0258788 A1 | 9/2014 | Maruyama |
| 2014/0285211 A1 | 9/2014 | Raffinan |
| 2014/0331034 A1 | 11/2014 | Ponce et al. |
| 2015/0006766 A1 | 1/2015 | Ponce et al. |
| 2015/0012690 A1 | 1/2015 | Bruce et al. |
| 2015/0032937 A1 | 1/2015 | Salessi |
| 2015/0032938 A1 | 1/2015 | Salessi |
| 2015/0067243 A1 | 3/2015 | Salessi et al. |
| 2015/0149697 A1 | 5/2015 | Salessi et al. |
| 2015/0149706 A1 | 5/2015 | Salessi et al. |
| 2015/0153962 A1 | 6/2015 | Salessi et al. |
| 2015/0169021 A1 | 6/2015 | Salessi et al. |
| 2015/0261456 A1 | 9/2015 | Alcantara et al. |
| 2015/0261475 A1 | 9/2015 | Alcantara et al. |
| 2015/0261797 A1 | 9/2015 | Alcantara et al. |
| 2015/0370670 A1 | 12/2015 | Lu |
| 2015/0371684 A1 | 12/2015 | Mataya |
| 2015/0378932 A1 | 12/2015 | Souri et al. |
| 2016/0026402 A1 | 1/2016 | Alcantara et al. |
| 2016/0027521 A1 | 1/2016 | Lu |
| 2016/0041596 A1 | 2/2016 | Alcantara et al. |

FOREIGN PATENT DOCUMENTS

| | | |
|---|---|---|
| TW | 200428219 A | 12/2004 |
| TW | I420316 | 12/2013 |
| WO | WO 94/06210 | 3/1994 |

OTHER PUBLICATIONS

Office Action for U.S. Appl. No. 13/475,878 mailed on Jun. 23, 2014.
Office Action for U.S. Appl. No. 12/876,113 mailed on Jul. 11, 2014.
Office Action for U.S. Appl. No. 12/876,113 mailed on Oct. 16, 2014.
Notice of Allowance for U.S. Appl. No. 12/270,626 mailed Oct. 3, 2014.
Office Action for U.S. Appl. No. 12/270,626 mailed on May 23, 2014.
Office Action for U.S. Appl. No. 12/270,626 mailed on Apr. 4, 2011.
Office Action for U.S. Appl. No. 12/270,626 mailed on Dec. 18, 2013.
Office Action for U.S. Appl. No. 12/270,626 mailed on Mar. 15, 2013.
Office Action for U.S. Appl. No. 12/270,626 mailed on Aug. 23, 2012.
Office Action mailed Sep. 11, 2015 for U.S. Appl. No. 14/217,436.
Office Action mailed Sep. 24, 2015 for U.S. Appl. No. 14/217,334.
Office Action dated Sep. 18, 2015 for Taiwanese Patent Application No. 102144165.
Office Action mailed Sep. 29, 2015 for U.S. Appl. No. 14/217,316.
Office Action mailed Sep. 28, 2015 for U.S. Appl. No. 14/689,045.
Office Action for U.S. Appl. No. 13/475,878, mailed on Jun. 23, 2014.
Office Action for U.S. Appl. No. 12/270,626 mailed on Feb. 3, 2012.
Notice of Allowance/Allowability for U.S. Appl. No. 12/270,626 mailed on Oct. 3, 2014.
Advisory Action for U.S. Appl. No. 12/876,113 mailed on Oct. 16, 2014.
Office Action for U.S. Appl. No. 14/297,628 mailed on Jul. 17, 2015.
Office Action for U.S. Appl. No. 13/475,878 mailed on Dec. 4, 2014.
USPTO Notice of Allowability & attachment(s) mailed Jan. 7, 2013 for U.S. Appl. No. 12/876,247.
Office Action mailed Sep. 14, 2012 for U.S. Appl. No. 12/876,247.
Office Action mailed Feb. 1, 2012 for U.S. Appl. No. 12/876,247.
Notice of Allowance/Allowability mailed Mar. 31, 2015 for U.S. Appl. No. 13/475,878.
Office Action mailed May 22, 2015 for U.S. Appl. No. 13/253,912.
Office Action for U.S. Appl. No. 12/876,113 mailed on Mar. 13, 2014.
Advisory Action for U.S. Appl. No. 12/876,113 mailed on Sep. 6, 2013.
Office Action for U.S. Appl. No. 12/876,113 mailed on May 14, 2013.
Office Action for U.S. Appl. No. 12/876,113 mailed on Dec. 21, 2012.
Security Comes to SNMP: The New SNMPv3 Proposed Internet Standard, The Internet Protocol Journal, vol. 1, No. 3, Dec. 1998.
Notice of Allowability for U.S. Appl. No. 12/882,059 mailed on May 30, 2013.
Notice of Allowability for U.S. Appl. No. 12/882,059 mailed on Feb. 14, 2013.
Office Action for U.S. Appl. No. 12/882,059 mailed on May 11, 2012.
Notice of Allowability for U.S. Appl. No. 14/038,684 mailed on Aug. 1, 2014.

(56) References Cited

OTHER PUBLICATIONS

Office Action for U.S. Appl. No. 14/038,684 mailed on Mar. 17, 2014.
Notice of Allowance/Allowability for U.S. Appl. No. 13/890,229 mailed on Feb. 20, 2014.
Office Action for U.S. Appl. No. 13/890,229 mailed on Oct. 8, 2013.
Office Action for U.S. Appl. No. 12/876,113 mailed on Dec. 5, 2014.
Notice of Allowance/Allowabilty for U.S. Appl. No. 12/876,113 mailed on Jun. 22, 2015.
Office Action for U.S. Appl. No. 14/217,249 mailed on Apr. 23, 2015.
Office Action for U.S. Appl. No. 14/215,414 mailed on Jun. 4, 2015.
Office Action for U.S. Appl. No. 14/616,700 mailed on Apr. 30, 2015.
Office Action for U.S. Appl. No. 14/217,436 mailed on Sep. 11, 2015.
Office Action mailed Dec. 5, 2014 for U.S. Appl. No. 14/038,684.
Office Action mailed Oct. 8, 2015 for U.S. Appl. No. 14/217,291.
Office Action mailed Dec. 15, 2015 for U.S. Appl. No. 13/253,912.
Office Action mailed Dec. 17, 2015 for U.S. Appl. No. 14/214,216.
Office Action mailed Dec. 17, 2015 for U.S. Appl. No. 14/215,414.
Office Action mailed Dec. 17, 2015 for U.S. Appl. No. 14/803,107.
Office Action mailed Jan. 15, 2016 for U.S. Appl. No. 14/866,946.
Office Action mailed Jan. 11, 2016 for U.S. Appl. No. 14/217,399.
Office Action mailed Jan. 15, 2016 for U.S. Appl. No. 14/216,937.
National Science Fountation,Award Abstract #1548968, SBIR Phase I: SSD In-Situ Processing, http://www.nsf.gov/awardsearch/showAward?AWD_ID=1548968 printed on Feb. 13, 2016.
Design-Reuse, NxGn Data Emerges from Stealth Mode to provide a paradigm shift in enterprise storage solution, http://www.design-reuse.com/news/35111/nxgn-data-intelligent-solutions.html, printed on Feb. 13, 2016.
Notice of Allowance and Examiner-Initiated Interview Summary, mailed Jan. 29, 2016 for U.S. Appl. No. 14/297,628.
Office Action for U.S. Appl. No. 14/217,365 dated Feb. 18, 2016.
Office Action for U.S. Appl. No. 14/217,365 dated Mar. 2, 2016.
Office Action for U.S. Appl. No. 14/690,305 dated Feb. 25, 2016.
Office Action for U.S. Appl. No. 14/217,436 dated Feb. 25, 2016.
Office Action for U.S. Appl. No. 14/217,316 dated Feb. 26, 2016.
Office Action for U.S. Appl. No. 14/215,414 dated Mar. 1, 2016.
Office Action for U.S. Appl. No. 14/616,700 dated Mar. 8, 2016.
Notice of allowance/allowability for U.S. Appl. No. 13/253,912 dated Mar. 21, 2016.
Notice of allowance/allowability for U.S. Appl. No. 14/803,107 dated Mar. 28, 2016.
Office Action for U.S. Appl. No. 14/217,334 dated Apr. 4, 2016.
Notice of allowance/allowability for U.S. Appl. No. 14/217,041 dated Apr. 11, 2016.

* cited by examiner

HARDWARE-ASSISTED DMA TRANSFER WITH DEPENDENCY TABLE CONFIGURED TO PERMIT-IN PARALLEL-DATA DRAIN FROM CACHE WITHOUT PROCESSOR INTERVENTION WHEN FILLED OR DRAINED

CROSS-REFERENCE(S) TO RELATED APPLICATIONS

This application claims the benefit of and priority to U.S. Provisional Application 61/802,367, filed 15 Mar. 2013. This U.S. Provisional Application 61/802,367 is hereby fully incorporated herein by reference.

BACKGROUND

1. Field

The present invention relates to a data storage system which is applied to a computer system, that includes volatile (e.g. SRAM, SDRAM) and non-volatile (e.g. flash memory, mechanical hard disk) storage components.

2. Description of the Related Art

In conventional storage device system, data transfer from memory to IO bus has to go through an intermediate volatile memory (cache). Data transfer therefore can be completed in two steps—data is transferred from memory to cache and then from cache to the IO bus. Memory-to-cache data transfer is handled by one DMA engine and another DMA engine for cache-to-IO bus data transfer. To start the transfer, the processor prepares the DMA transfer from memory to cache. Upon completion of the memory-to-cache transfer, the processor is interrupted to prepare the transfer from cache to IO. While the first data buffer in the cache is being drained, another data buffer can be filled concurrently in memory. The data transfer continues in this fashion, two DMA engines operating in parallel utilizing multiple data buffer spaces in the cache. Notice that in between transfers, the processor has to intervene to setup the next transfer utilizing the precious processor cycles. Note that each of the transfers, memory-to-cache and cache-to-IO, can also be handled using two or more DMA engines; either DMA engines are used sequentially or simultaneously.

DETAILED DESCRIPTION

Figure 1:
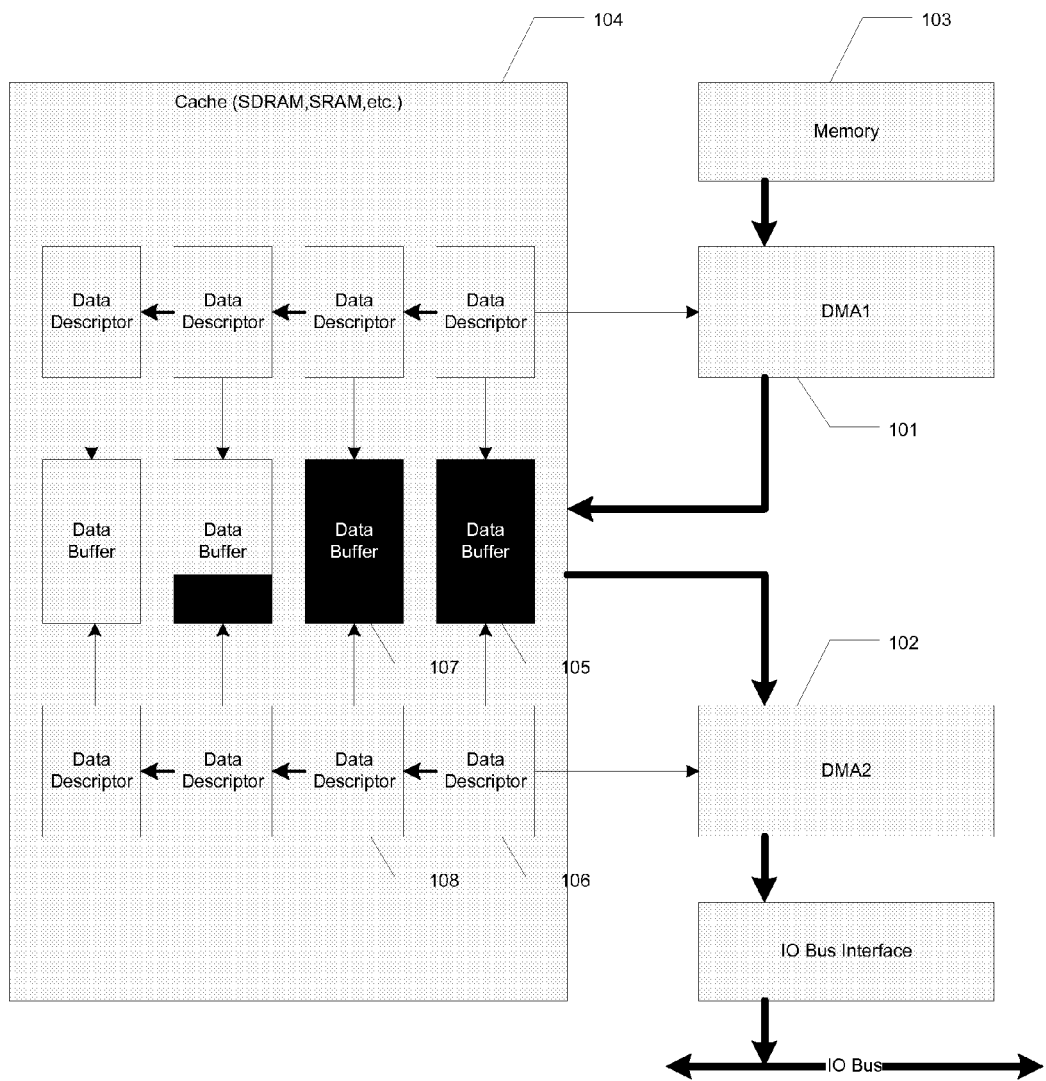
FIG. 1 is a diagram illustrating the conventional way of transferring data from memory (flash) to IO bus where the processor must periodically interfere with the transfer.

In conventional storage device system as shown in FIG. 1, where data has to be transferred from memory 103 to cache 104, the processor has to periodically interfere the process preparing and enabling DMA engines between transfer boundaries. Before a DMA transfer can start, information like the source and destination start address, size of the data to transfer, etc are normally supplied first. One set of this information can be called as descriptor. Instead of preparing another descriptor after completing a DMA transfer just before starting the next transfer, it can be done more efficiently by initially preparing a reasonable number of descriptors then let the DMA engines do the fetching, decoding and execution of descriptors by itself. The FW then will just keep adding more descriptors to the list of descriptors. In FIG. 1, DMA1 101 has to do 4 DMA transfers from memory 103 to cache 104 utilizing 4 data buffers. DMA2 102 has to transfer the data from data buffers to the IO bus. DMA1 101 and DMA2 102 will need 4 descriptors each. Assuming that all descriptors have already been prepared, DMA1 101 now has to start transferring data. After DMA1 101 has filled the first data buffer 105, the FW is notified through interrupt. FW then enables the corresponding descriptor 106 of DMA2 102. The rest of the descriptors will not be enabled since the corresponding data buffers are not yet ready for draining. DMA2 102 starts draining the first data buffer 105 while DMA1 101 is filling up the next data buffer 107. The processor is interrupted again after DMA1 101 has filled up the second data buffer 107. FW enables the next descriptor 108 so DMA2 102 can start draining the second data buffer 107 as soon as it is done with the first data buffer 105. The sequence continues until all 4 data buffers are filled from memory 103 and drained to the IO bus. Notice that the processor is interrupted each time DMA1 101 has finished filling up a data buffer. Note also that DMA2 102 must interrupt the processor after draining a data buffer to free up the used resources. The above process can be improved by minimizing the intervention of the processor. This means that while DMA1 101 is filling up a data buffer, DMA2 102 must have a way to know when it can start draining the data buffer and that DMA2 102 must have a way to free up used resources all without the help of the processor. This can be done with the use of a dependency table 209 as shown in FIG. 2.

The Index field 210 in the dependency table 209 corresponds to a transfer where all the descriptors 206, 208 & 212 of the DMA controllers 201 & 202 are tied to. An Index contains 3 Buffers 210, BufRdy0, BufRdy1 and BufRdy2. A Buffer may hold the sub-indices of an Index of the DMA controllers involved in the transfer. For example, BufRdy0 may hold the sub-indices of DMA1 201. Each bit in the BufRdy field corresponds to a sub-index 211 which is a section stored/fetched on single cache buffer 205 & 207 on the SDRAM/SRAM. A sub-index 210 is said to be "allocated or pending" when its bit is set to 0 and "done" when set to its default value of 1. An Index field 210 is considered to be "free" when all the sub-indices of the 3 Buffers 210 are "done". Assuming a read command is received from the IO bus, the FW recognizes that the requested data is in the memory 203. The FW prepares the descriptors for DMA2 202. During preparation of DMA2 202 first descriptor 206, the processor checks the dependency table 209 to see if there is an available Index 210. The processor sees Index 0 is free. Index number 0 is assigned to DMA2 202 first descriptor 206. The processor allocates the sub-index 211 bits, from 1 to 0, of Index 0 based on the section(s) of the data buffers 205 & 207 that to be used in data transfer and for example, the processor assigns BufRdy0 sub-indices 211 to DMA1 201 as the Source and BufRdy1 sub-indices 211 to DMA2 202 as the Destination. As an overview, the Source is the one responsible for updating the allocated sub-indices of the chosen Index when the data is already transferred to cache 204. The Destination, on the other hand, is the one responsible for monitoring the allocated sub-indices of the chosen Index when a particular allocated sub-index is already done, from 0 to 1. While DMA2 202 descriptors are being prepared, DMA1 201 descriptors can be prepared in parallel. Each descriptor pair must point to the same data buffer. In this case, both DMA1 201 first descriptor 212 and DMA2 202 first descriptor 206 point to the first data buffer 205. Since Index 0 is "free", once the first descriptor 212 of DMA1 201 is ready, DMA1 201 can start transferring data from memory 203 to cache 204 filling up the first data buffer 205. Once the data needed are already transferred to the first data buffer 205, DMA1 201 will update the allocated sub-indices, from 0 to 1. DMA2 202 is monitoring the state of the allocated sub-indices. When all of the allocated sub-indices of Index 0 are updated, it will become "free". Every time an allocated sub-index of Index 0 is updated, DMA2 202 may start draining the data from the data buffer section pointed by the updated sub-index. When Index 0 becomes "free" it will be available for another transfer. While the first data buffer 205 is being drained, DMA1 201 can start filling up the next data buffer 207. The transfer continues in this fashion, the invention updating and monitoring the dependency table 209, until all data is transferred from memory 203 to IO bus. As mentioned, saves the system precious cycles by eliminating the need for processor intervention for every completed transfer.

Figure 3:
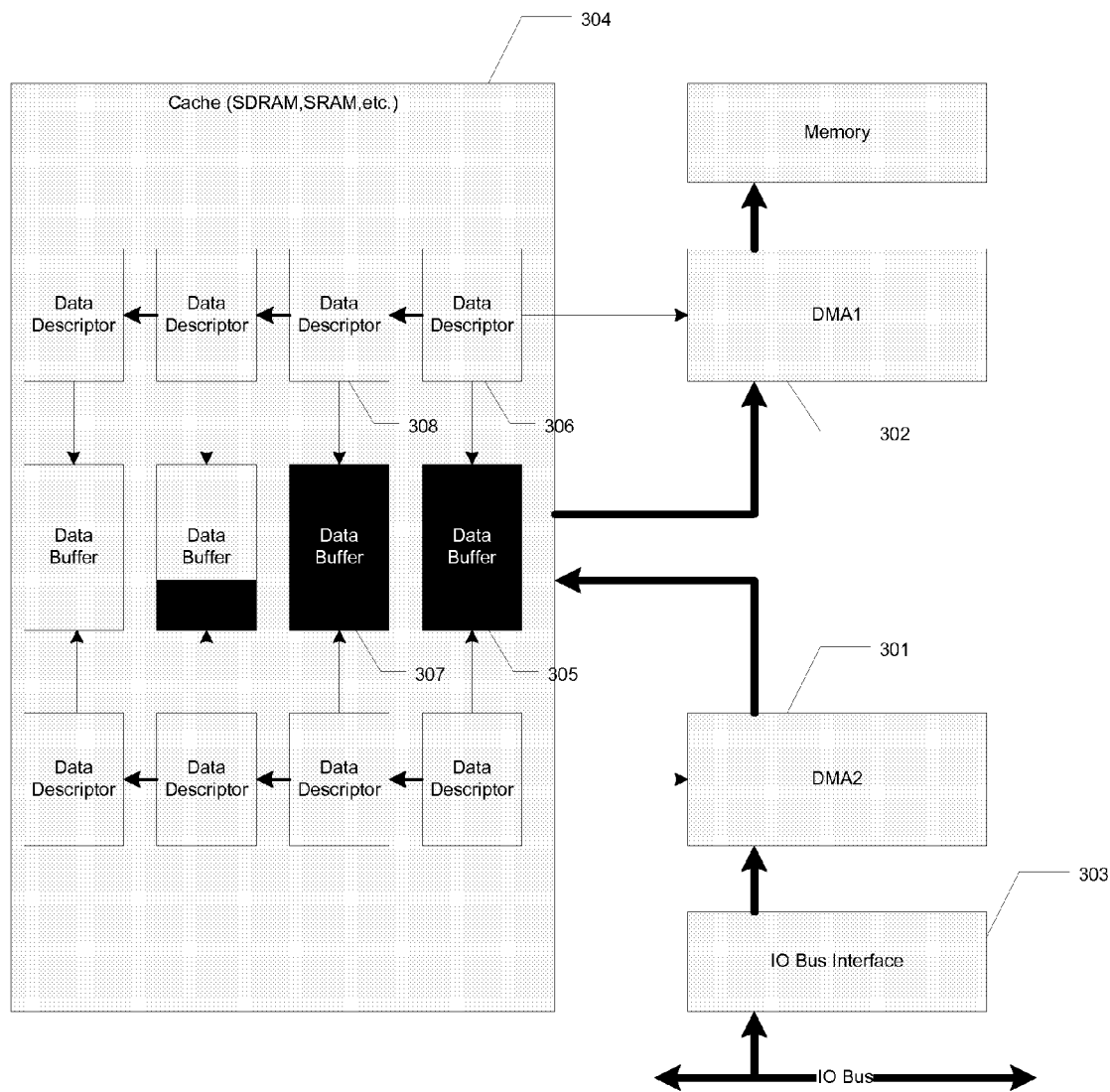
FIG. 3 is a diagram illustrating the conventional way of transferring data from IO bus to memory (flash) where the processor must periodically interfere with the transfer.

FIG. 3 is almost the same as FIG. 1 except that the source of data is from the IO Bus Interface 303. The data has to be transferred from IO Bus Interface 303 to cache 304, the processor has to periodically interfere the process preparing and enabling DMA engines between transfer boundaries. Before a DMA transfer can start, information like the source and destination start address, size of the data to transfer, etc are normally supplied first. One set of this information can be called as descriptor. Instead of preparing another descriptor after completing a DMA transfer just before starting the next transfer, it can be done more efficiently by initially preparing a reasonable number of descriptors then let the DMA engines do the fetching, decoding and execution of descriptors by itself. The FW then will just keep adding more descriptors to the list of descriptors. In FIG. 3, DMA2 301 has to do 4 DMA transfers from IO Bus Interface 303 to cache 304 utilizing 4 data buffers. DMA1 302 has to transfer the data from data buffers to the memory. DMA2 301 and DMA1 302 will need 4 descriptors each. Assuming that all descriptors have already been prepared, DMA2 301 now has to start transferring data. After DMA3 301 has filled the first data buffer 305, the FW is notified through interrupt. FW then enables the corresponding descriptor 306 of DMA1 302. The rest of the descriptors will not be enabled since the corresponding data buffers are not yet ready for draining. DMA1 302 starts draining the first data buffer 305 while DMA2 301 is filling up the next data buffer 307. The processor is interrupted again after DMA2 301 has filled up the second data buffer 307. FW enables the next descriptor 308 so DMA1 302 can start draining the second data buffer 307 as soon as it is done with the first data buffer 305. The sequence continues until all 4 data buffers are filled from IO Bus Interface 303 and drained to the memory. Notice that the processor is interrupted each time DMA2 301 has finished filling up a data buffer. Note also that DMA1 302 must interrupt the processor after draining a data buffer to free up the used resources. The above process can be improved by minimizing the intervention of the processor. This means that while DMA2 301 is filling up a data buffer, DMA1 302 must have a way to know when it can start draining the data buffer and that DMA1 302 must have a way to free up used resources all without the help of the processor.

Figure 2:
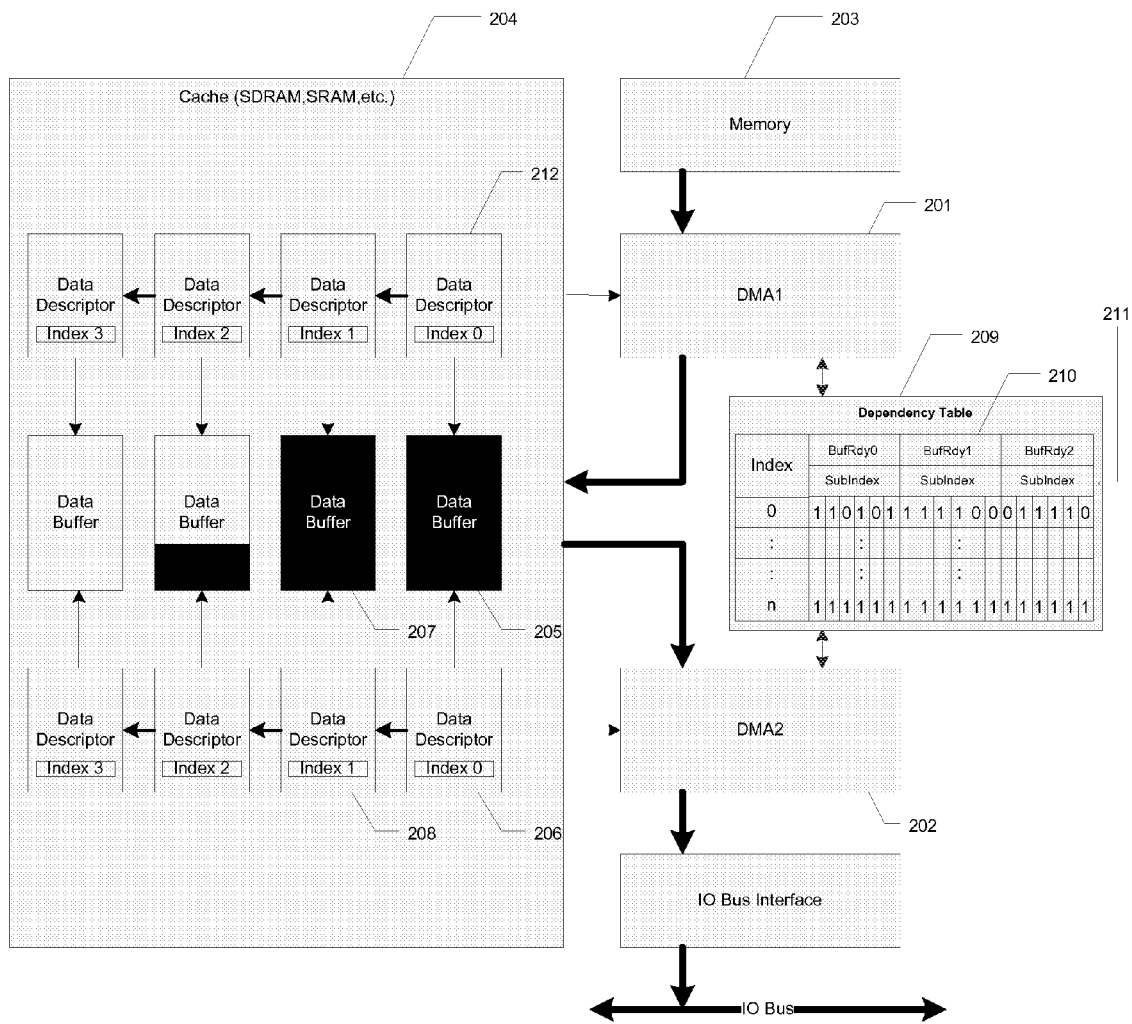
FIG. 2 is a diagram illustrating the novel way of transferring data from memory (flash) to IO bus where the process is handled with less intervention from the processor.
Figure 4:
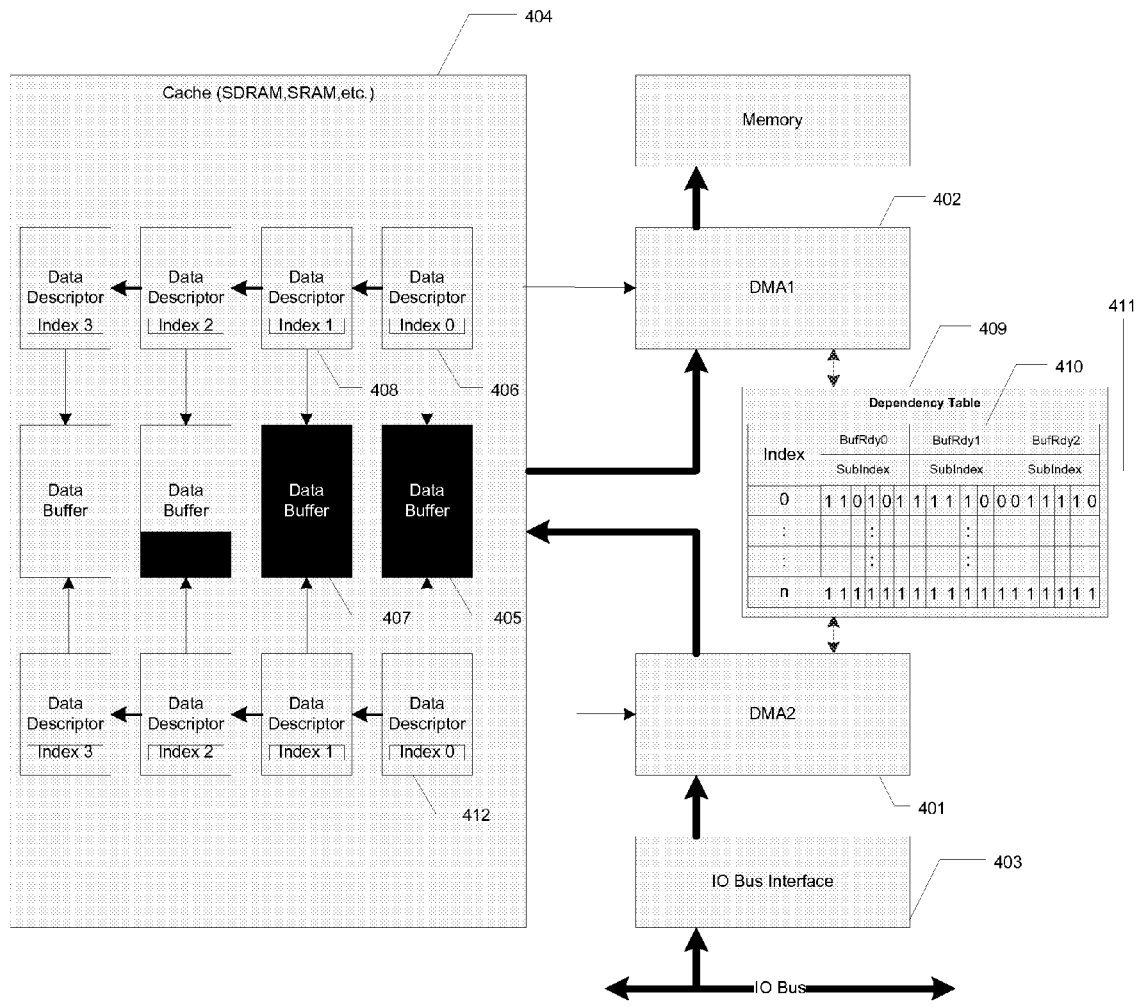
FIG. 4 is a diagram illustrating the novel way of transferring data from IO bus to memory (flash) where the process is handled with less intervention from the processor.

FIG. 4 is almost the same as FIG. 2 except that the source of data is from the IO Bus Interface 403. The Index field 410 in the dependency table 409 corresponds to a transfer where all the descriptors 406, 408 & 412 of the DMA controllers 401 & 402 are tied to. An Index contains 3 Buffers 410, BufRdy0, BufRdy1 and BufRdy2. A Buffer may hold the sub-indices of an Index of the DMA controllers involved in the transfer. For example, BufRdy0 may hold the sub-indices of DMA2 401. Each bit in the BufRdy field corresponds to a sub-index 411 which is a section stored/fetched on single cache buffer 405 & 407 on the SDRAM/SRAM. A sub-index 410 is said to be "allocated or pending" when its bit is set to 0 and "done" when set to its default value of 1. An Index field 410 is considered to be "free" when all the sub-indices of the 3 Buffers 410 are "done". Assuming a read command is received from the memory, the FW recognizes that the requested data is in the IO bus 403. The FW prepares the descriptors for DMA1 402. During preparation of DMA1 402 first descriptor 406, the processor checks the dependency table 409 to see if there is an available Index 410. The processor sees Index 0 is free. Index number 0 is assigned to DMA1 402 first descriptor 406. The processor allocates the sub-index 411 bits, from 1 to 0, of Index 0 based on the section(s) of the data buffers 405 & 407 that to be used in data transfer and for example, the processor assigns BufRdy0 sub-indices 411 to DMA2 401 as the Source and BufRdy1 sub-indices 411 to DMA1 402 as the Destination. As an overview, the Source is the one responsible for updating the allocated sub-indices of the chosen Index when the data is already transferred to cache 404. The Destination, on the other hand, is the one responsible for monitoring the allocated sub-indices of the chosen Index when a particular allocated sub-index is already done, from 0 to 1. While DMA1 402 descriptors are being prepared, DMA2 401 descriptors can be prepared in parallel. Each descriptor pair must point to the same data buffer. In this case, both DMA2 401 first descriptor 412 and DMA1 402 first descriptor 406 point to the first data buffer 405. Since Index 0 is "free", once the first descriptor 412 of DMA2 401 is ready, DMA2 401 can start transferring data from IO bus 403 to cache 404 filling up the first data buffer 405. Once the data needed are already transferred to the first data buffer 405, DMA2 401 will update the allocated sub-indices, from 0 to 1. DMA1 402 is monitoring the state of the allocated sub-indices. When all of the allocated sub-indices of Index 0 are updated, it will become "free". Every time an allocated sub-index of Index 0 is updated, DMA1 402 may start draining the data from the data buffer section pointed by the updated sub-index. When Index 0 becomes "free" it will be available for another transfer. While the first data buffer 405 is being drained, DMA2 401 can start filling up the next data buffer 407. The transfer continues in this fashion, the invention updating and monitoring the dependency table 409, until all data is transferred from IO bus 403 to memory. As mentioned, the whole process saves the processor precious processor cycle by eliminating the need for processor intervention for every completed transfer.

Figure 5:
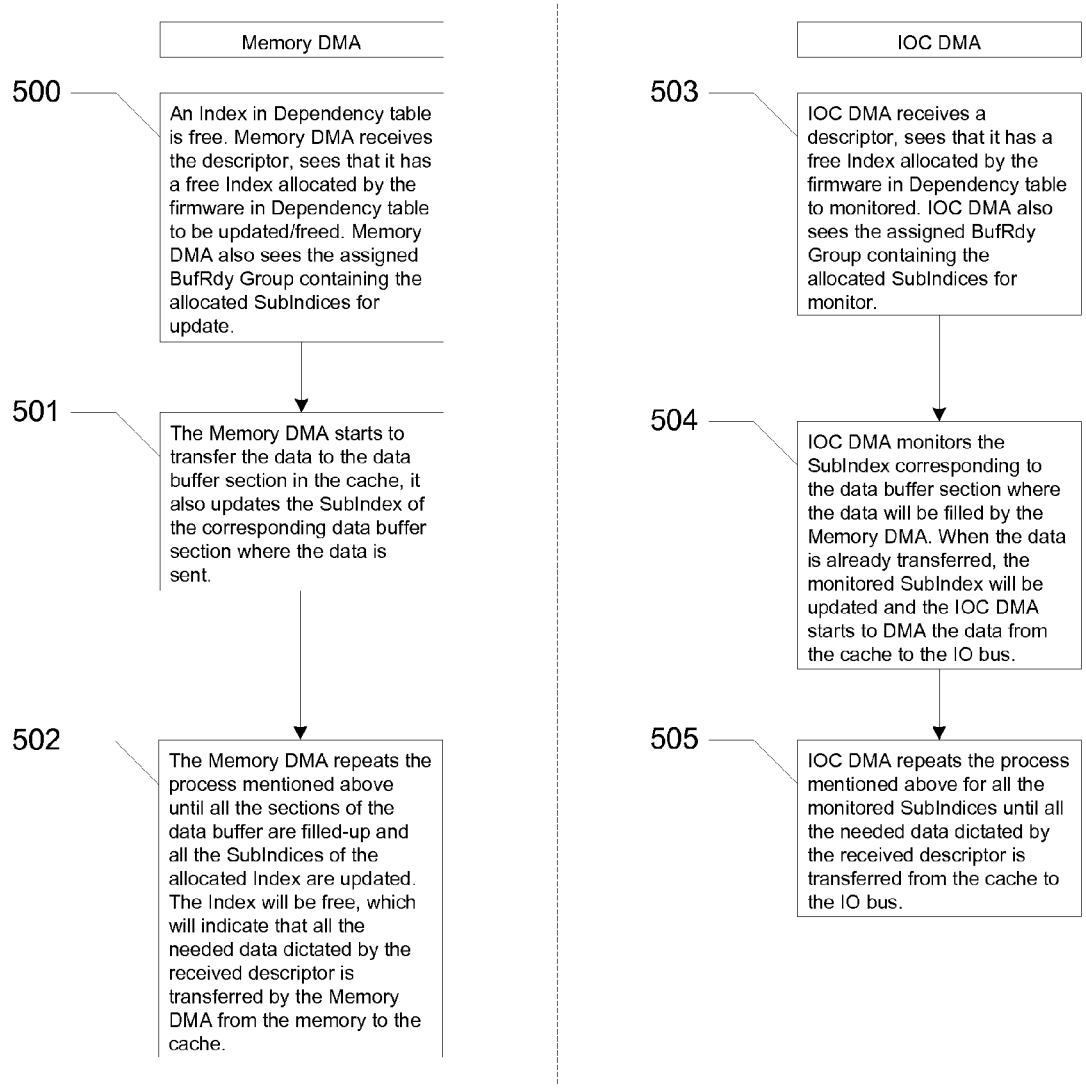
FIG. 5 is a diagram illustrating the DMA process with dependency from memory (flash) to IO bus.

FIG. 5 shows the basic process flow for the DMA using the dependency according to an embodiment of the present invention. This figure describes the steps the Memory DMA and the IOC DMA perform. The direction of the data transfer is from the memory to the IO bus. Steps 500 to 502 describes the Memory DMA side dependency. In step 500, an Index in the Dependency table is free. Memory DMA receives the descriptor, sees that it has a free Index allocated by the firmware in Dependency table to be updated/freed. Memory DMA also sees the assigned BufRdy Group containing the allocated sub-indices for update. In step 501, the Memory DMA starts to transfer the data to the data buffer section in the cache, it also updates the sub-index of the corresponding data buffer section where the data is sent. In step 502, the Memory DMA repeats the process mentioned above until all the sections of the data buffer are filled-up and all the sub-indices of the allocated Index are updated. The Index will be free, which will indicate that all the needed data dictated by the received descriptor is transferred by the Memory DMA from the memory to the cache. Steps 503 to 505 describes the IOC DMA side dependency. In step 503, IOC DMA receives a descriptor, sees that it has a free Index allocated by the firmware in Dependency table to monitored. IOC DMA also sees the assigned BufRdy Group containing the allocated sub-indices for monitor. In step 504, IOC DMA monitors the sub-index corresponding to the data buffer section where the data will be filled by the Memory DMA. When the data is already transferred, the monitored sub-index will be updated and the IOC DMA starts to DMA the data from the cache to the IO bus. In step 505, IOC DMA repeats the process mentioned above for all the monitored sub-indices until all the needed data dictated by the received descriptor is transferred from the cache to the IO bus.

Figure 6:
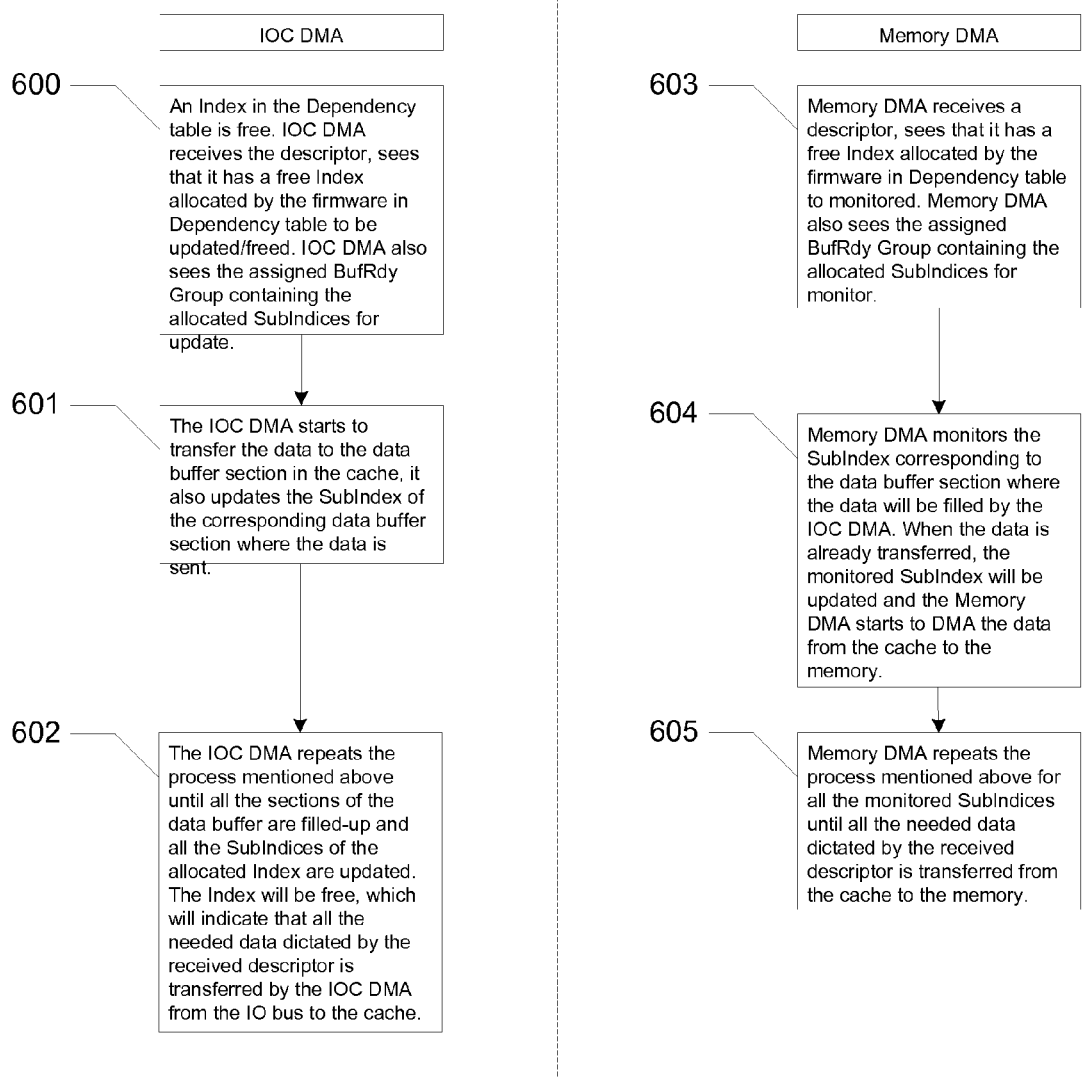
FIG. 6 is a diagram illustrating the DMA process with dependency from IO bus to memory (flash).

FIG. 6 is the same as FIG. 5 except that the direction of the data transfer is from the IO bus to the memory. Steps 600 to 602 describes the IOC DMA side dependency. In step 600, an Index in the Dependency table is free. IOC DMA receives the descriptor, sees that it has a free Index allocated by the firmware in Dependency table to be updated/freed. IOC DMA also sees the assigned BufRdy Group containing the allocated sub-indices for update. In step 601, the IOC DMA starts to transfer the data to the data buffer section in the cache, it also updates the sub-index of the corresponding data buffer section where the data is sent. In step 602, the IOC DMA repeats the process mentioned above until all the sections of the data buffer are filled-up and all the sub-indices of the allocated Index are updated. The Index will be free, which will indicate that all the needed data dictated by the received descriptor is transferred by the IOC DMA from the IO bus to the cache. Steps 603 to 605 describes the Memory DMA side dependency. In step 603, Memory DMA receives a descriptor, sees that it has a free Index allocated by the firmware in Dependency table to monitored. Memory DMA also sees the assigned BufRdy Group containing the allocated sub-indices for monitor. In step 604, Memory DMA monitors the sub-index corresponding to the data buffer section where the data will be filled by the IOC DMA. When the data is already transferred, the monitored sub-index will be updated and the Memory DMA starts to DMA the data from the cache to the memory. In step 605, Memory DMA repeats the process mentioned above for all the monitored sub-indices until all the needed data dictated by the received descriptor is transferred from the cache to the memory.

Figure 7:
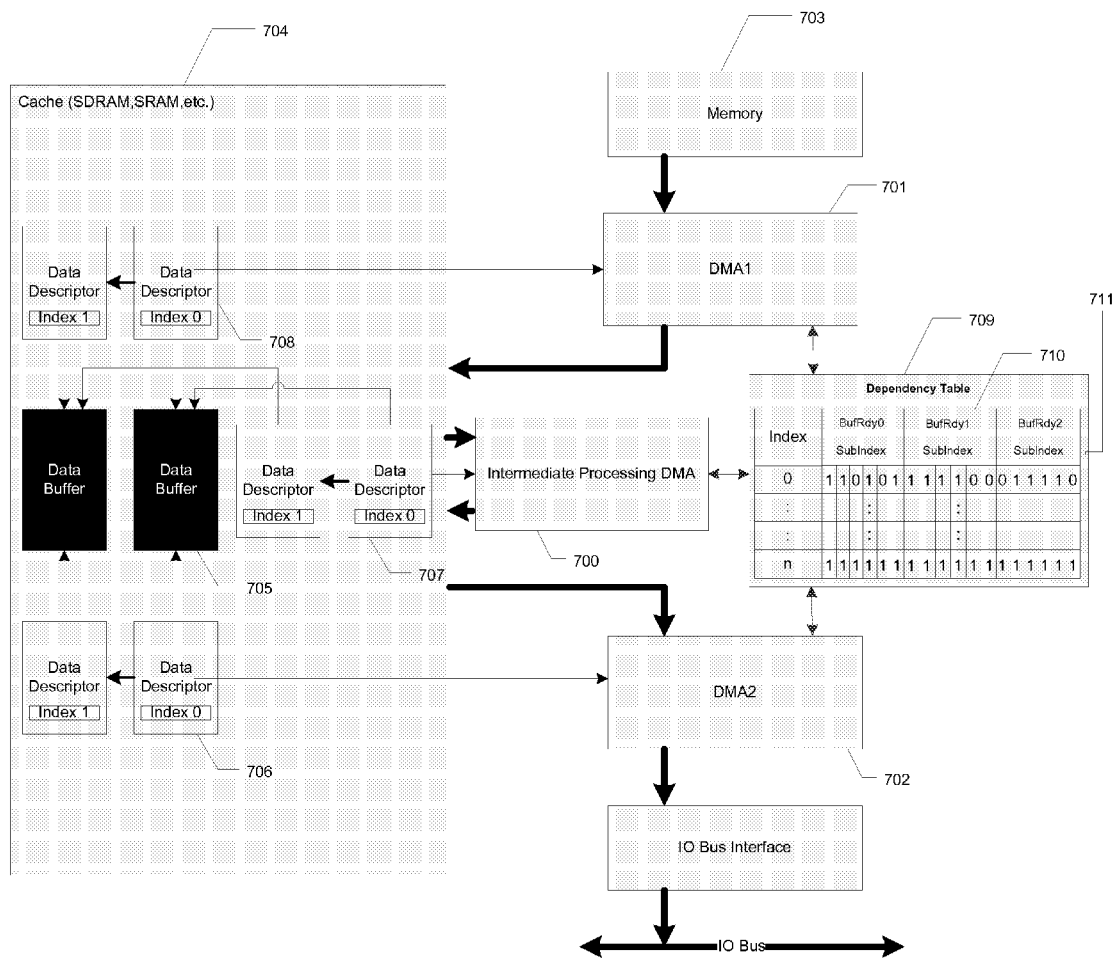
FIG. 7 is a diagram illustrating a variation of DMA process with dependency from memory (flash) to IO bus with the addition of a third DMA engine for intermediate processing.

FIG. 7 describes a variation a DMA process applying the invention for data transfer from memory (flash) 703 to IO bus. The process flow is almost the same as the process flow in FIG. 2 except that instead the data transferred from the memory (flash) 703 to the cache 704 will be fetched from it 704 and will be transferred directly to the IO bus, the data from the cache 704 will be sent first to the third DMA engine 700 for intermediate processing and the processed data will now be transferred to IO bus. The processor will check the Dependency table 709 for a free Index and the processor sees Index 0 710 is free and ready for allocation. The processor sets up the tied descriptors 708, 706 and 707 for DMA1 701, DMA2 702 and Intermediate Processing DMA 700. Each of these descriptors corresponds to the free Index 0 710 and its sub-indices 710 are pointed to the data buffer sections dictated by the descriptor. Also, the processor assigned BufRdy0 710 to DMA1 701 for updating data transfer from memory (flash) 703 to cache 704, BufRdy1 710 to Intermediate Processing DMA 700 for updating transfer of processed data from intermediate processing 700 back to cache 704 and BufRdy2 to DMA2 702 for updating transfer of processed data from cache 704 to IO bus. The descriptors for the 3 DMA engines will be executed simultaneously promoting less processor intervention. DMA1 701 will start transferring data from memory (flash) 703 to cache 704. Once data is transferred to a section of the data buffer 705 in the cache 704, DMA1 701 will update the corresponding sub-index 710 in BufRdy0 710, from 0 to 1 and Intermediate Processing DMA 700 monitoring the sub-index will be informed that it 700 can start draining the data from the cache 704 for processing. Note that while an intermediate processing is ongoing, data transfer from the memory 703 to cache 704 and from cache 704 to intermediate processing will continue. When the intermediate processing is finished, the processed data will be sent back to cache 704 and Intermediate Processing DMA 700 will be the one to update the corresponding sub-index 710 in BufRdy1 710, from 0 to 1 and DMA2 702 monitoring the sub-index will be informed that it 702 can start draining the processed data from cache 704 to IO bus. Once the processed data is transferred already to IO bus, DMA2 702 will update the corresponding sub-index 710 in BufRdy2 710. This process flow will be repeated until all allocated sub-indices in all BufRdy Groups 710 of Index 0 710 are updated indicating the data transfer dictated by the descriptor is finished and Index 0 will be freed up; ready for another data transfer.

Figure 8:
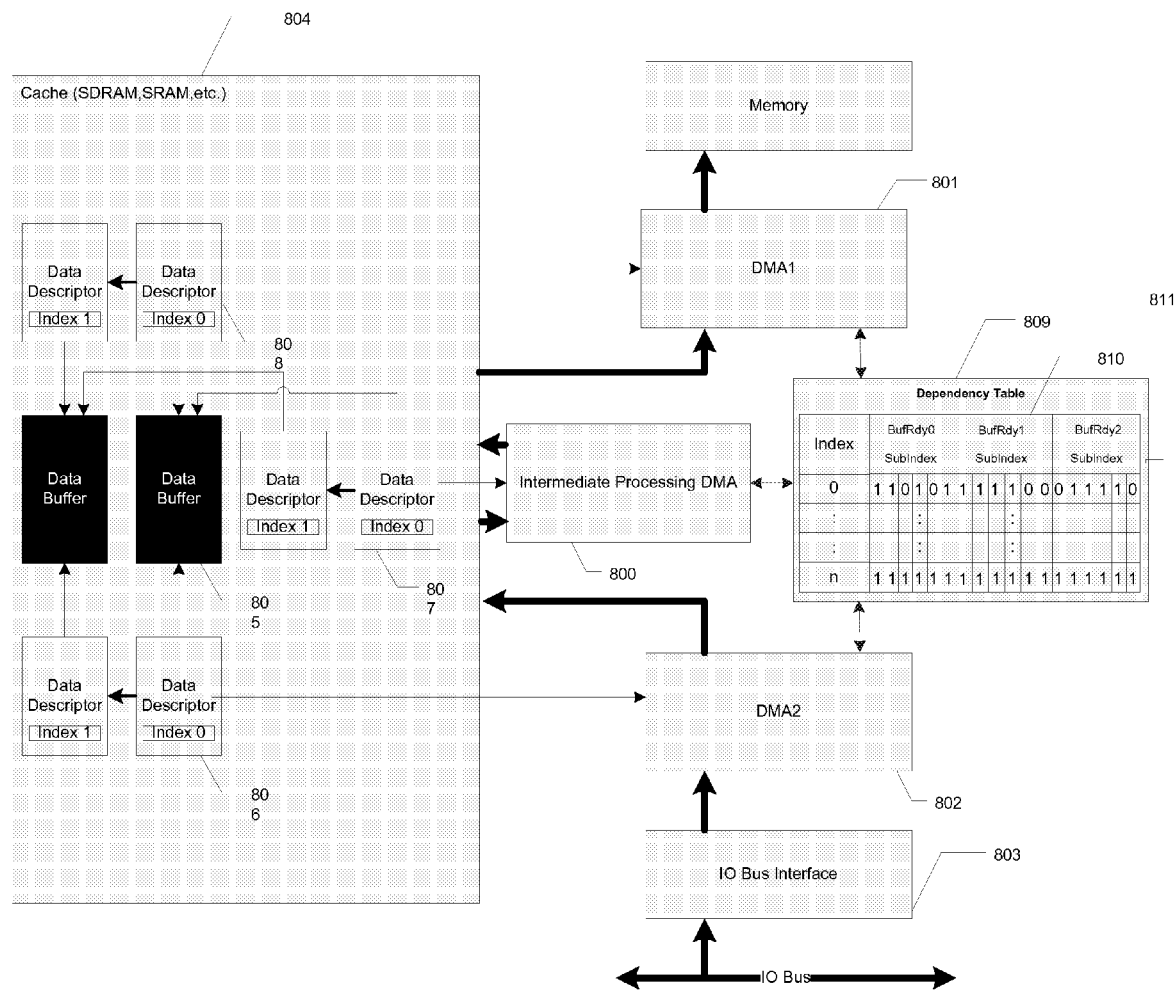
FIG. 8 is a diagram illustrating a variation of DMA process with dependency from IO bus to memory (flash) with the addition of a third DMA engine for intermediate processing.

FIG. 8 describes a variation a DMA process applying the invention for data transfer from IO bus 803 to memory (flash). The process flow is almost the same as the process flow in FIG. 4 except that instead the data transferred from the IO bus 803 to the cache 804 will be fetched from it 804 and will be transferred directly to the memory (flash), the data from the cache 804 will be sent first to the third DMA engine 800 for intermediate processing and the processed data will now be transferred to memory (flash). The processor will check the Dependency table 809 for a free Index and the processor sees Index 0 810 is free and ready for allocation. The processor sets up the tied descriptors 808, 806 and 807 for DMA1 801, DMA2 802 and Intermediate Processing DMA 800. Each of these descriptors corresponds to the free Index 0 810 and its sub-indices 810 are pointed to the data buffer sections dictated by the descriptor. Also, the processor assigned BufRdy0 810 to DMA2 802 for updating data transfer from IO bus 803 to cache 804, BufRdy1 810 to Intermediate Processing DMA 800 for updating transfer of processed data from intermediate processing 800 back to cache 804 and BufRdy2 to DMA1 801 for updating transfer of processed data from cache 804 to memory (flash). The descriptors for the 3 DMA engines will be executed simultaneously promoting less processor intervention. DMA2 802 will start transferring data from IO bus 803 to cache 804. Once data is transferred to a section of the data buffer 805 in the cache 804, DMA2 802 will update the corresponding sub-index 810 in BufRdy0 810, from 0 to 1 and Intermediate Processing DMA 800 monitoring the sub-index will be informed that it 800 can start draining the data from the cache 804 for processing. Note that while an intermediate processing is ongoing, data transfer from the IO bus 803 to cache 804 and from cache 804 to intermediate processing will continue. When the intermediate processing is finished, the processed data will be sent back to cache 804 and Intermediate Processing DMA 800 will be the one to update the corresponding sub-index 810 in BufRdy1 810, from 0 to 1 and DMA1 801 monitoring the sub-index will be informed that it 801 can start draining the processed data from cache 804 to memory (flash). Once the processed data is transferred already to memory (flash), DMA1 801 will update the corresponding sub-index 810 in BufRdy2 810. This process flow will be repeated until all allocated sub-indices in all BufRdy Groups 810 of Index 0 810 are updated indicating the data transfer dictated by the descriptor is finished and Index 0 will be freed up; ready for another data transfer.

Figure 9:
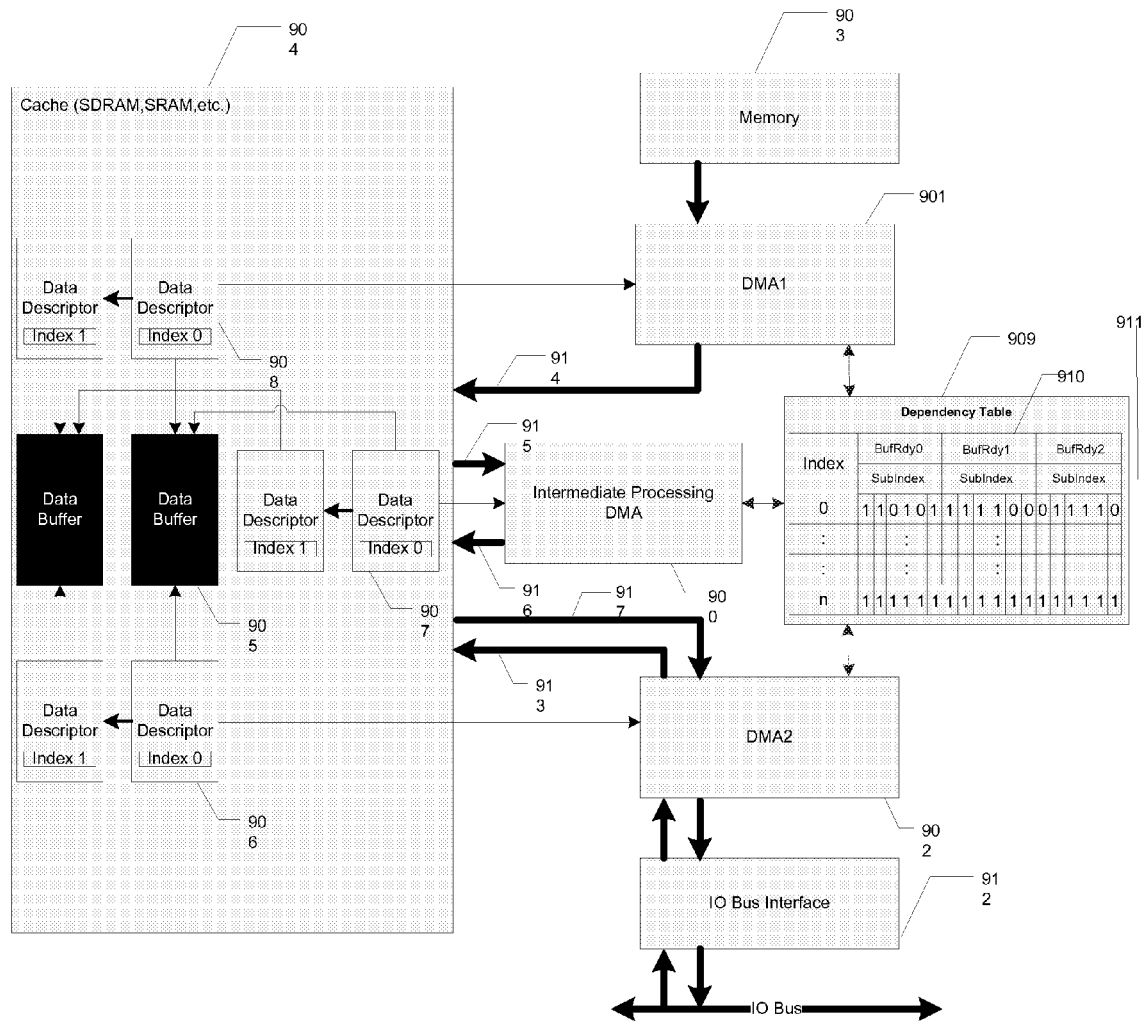
FIG. 9 is a diagram illustrating another variation of DMA process with dependency with the addition of a third DMA engine for intermediate processing by performing XOR operation.

FIG. 9 describes the other variation of DMA transfer with dependency where a third DMA engine for intermediate processing is involved. Here, the intermediate processing is different from what is described in FIG. 8 because a XOR operation will be performed. The processor sets up the tied descriptors 908, 907 and 906 for DMA1 901, Intermediate Processing DMA 900 and DMA2 902 pointing to the free Index 0 910 on Dependency Table 909. sub-index 0 911 of BufRdy0 910 is assigned to DMA2 902 for updating data transfer 913 from IO bus 912 to cache 904. sub-index 0 911 of BufRdy1 910 is assigned to DMA1 901 for updating data transfer 914 from memory (flash) 903 to cache 904. sub-index 1 911 of BufRdy0 910 is assigned to Intermediate Processing DMA 900 for updating transfer of processed data 916 from Intermediate Processing DMA 900 to cache 904. sub-index 1 911 of BufRdy1 910 is assigned to DMA2 902 for updating the transfer of processed data 917 from cache 904 to IO bus 912. The sub-indices 911 of BufRdy2 910 will not be used in the data transfer and the sub-indices 911 value will remain to 1. When the processor finished the setup of the Dependency Table 909 and the descriptors 906, 907 and 908 are executed, the data transfer begins. DMA2 902 will start transferring the data 913 from IO bus 912 to cache 904. Once the data 913 is transferred to cache 904, DMA2 902 will update sub-index 0 911 of BufRdy0 910, from 0 to 1 and Intermediate Processing DMA 900 monitoring the sub-index will be informed that it 900 can start draining the data 915 from cache 904 for processing. In parallel with the data transfer of DMA2 902, DMA1 901 will also start transferring the data 914 from memory (flash) 903 to cache 904. Once the data 914 is transferred to cache 904, DMA1 901 will update sub-index 0 911 of BufRdy1 910, from 0 to 1 and Intermediate Processing DMA 900 monitoring the sub-index will be informed that it 900 can start draining the data 915 from cache 904 for processing. After the XOR operation is performed for the data 913 and data 914 (collectively known as data 915), the XOR result data 916 will be transferred to cache 904. Once the data 916 is transferred to cache 904, Intermediate Processing DMA 900 will update sub-index 1 911 of BufRdy0 910, from 0 to 1 and DMA2 902 monitoring the sub-index will be informed that it 902 can start draining the XOR result data 917 (formerly XOR result data 916) from cache 904 to IO bus 912. Once the XOR result data 917 is transferred to IO bus 912, DMA2 902 will update sub-index 1 911 of BufRdy1 910, from 0 to 1. After this, Index 0 910 will be freed up indicating that the data transfer is completed.

Figure 10:
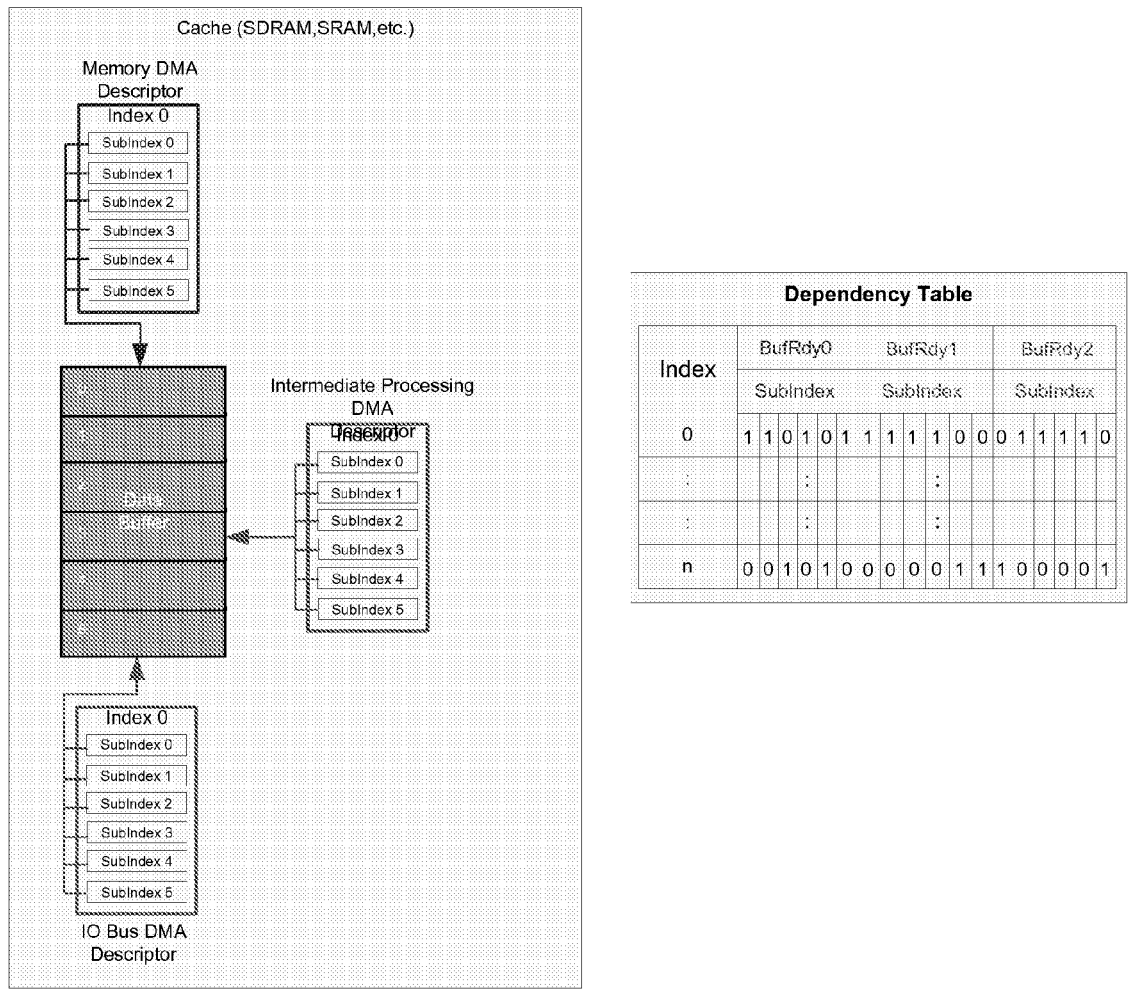
FIG. 10 is a diagram illustrating the Data Buffer-Descriptor-Dependency Table relationship.

FIG. 10 illustrates the relationship between the Data Buffer, Descriptor & Dependency Table. Each of the tied descriptors made by the processor corresponds to a free Index, as an example in FIG. 10, the free Index is Index 0. In the figure, the Memory DMA Descriptor is assigned to BufRdy0, the Intermediate Processing DMA Descriptor to BufRdy1 and the IO Bus DMA Descriptor to BufRdy2. Note that the three DMA engines can be assigned to other BufRdy. Each of the sub-indices in a BufRdy corresponds to a section of the Data Buffer.

Foregoing described embodiments of the invention are provided as illustrations and descriptions. They are not intended to limit the invention to precise form described. In particular, it is contemplated that functional implementation of invention described herein may be implemented equivalently in hardware, software, firmware, and/or other available functional components or building blocks, and that networks may be wired, wireless, or a combination of wired and wireless.

It is also within the scope of the present invention to implement a program or code that can be stored in a machine-readable or computer-readable medium to permit a computer to perform any of the inventive techniques described above, or a program or code that can be stored in an article of manufacture that includes a computer readable medium on which computer-readable instructions for carrying out embodiments of the inventive techniques are stored. Other variations and modifications of the above-described embodiments and methods are possible in light of the teaching discussed herein.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
   a memory DMA (direct memory access) engine;
   an IOC (input/output to cache) DMA engine;
   a cache;
   a dependency table configured to permit one of the memory DMA engine and IOC DMA engine to transmit data to the cache and to permit, in parallel, another one of the memory DMA engine and IOC DMA engine to drain data from the cache without processor intervention whenever a data buffer in the cache is filled or drained;
   wherein the dependency table comprises a plurality of index fields, wherein each of the plurality of index fields comprises a plurality of buffer fields;
   wherein the plurality of buffer fields comprises a first buffer field comprising a first plurality of sub-indices assigned to the memory DMA engine;
   wherein the plurality of buffer fields comprises a second buffer field comprising a second plurality of sub-indices assigned to the IOC DMA engine;

wherein the cache comprises a first descriptor for the memory DMA engine and a second descriptor for the IOC DMA engine and wherein the first descriptor and the second descriptor point to a first data buffer in the cache.

2. The apparatus of claim 1, wherein the memory DMA engine can start transferring data between a memory and a first buffer in the cache with one of the plurality of buffer fields having a first value;
wherein the IOC DMA engine can start transferring data between the first buffer in the cache and an IO bus interface with the one of the plurality of buffer fields having a second value.

3. The apparatus of claim 2, wherein one of the memory DMA engine and IOC DMA engine updates the one of the plurality of buffer fields between being free and being allocated; and wherein another one of the memory DMA engine and the IOC DMA engine monitors the one of the plurality of buffer fields as being free or as being allocated.

4. The apparatus of claim 3, wherein the memory DMA engine updates the one of the plurality of buffer fields for a read command and wherein the IOC DMA engine updates the one of the plurality of buffer fields for a write command.

5. The apparatus of claim 4, wherein the one of the plurality of buffer fields is free in response to data being transferred to a data buffer in the cache and the data being available to be drained from the data buffer.

6. The apparatus of claim 5, wherein the memory DMA engine can start transferring data between the memory and a second buffer in the cache with a second one of the plurality of buffer fields having the first value;
wherein the IOC DMA engine can start transferring data between the second buffer in the cache and the IO bus interface with the second one of the plurality of buffer fields having the second value.

7. The apparatus of claim 1, further comprising:
an intermediate processing DMA engine configured to process data from the cache.

8. The apparatus of claim 7, wherein the intermediate processing DMA engine can start transferring data between the cache and the intermediate processing DMA engine with one of the plurality of buffer fields having a second value.

9. A method, comprising:
permitting one of a memory DMA (Direct Memory Access) engine and IOC (input/output to cache) DMA engine to transmit data to a cache and permitting, in parallel, another one of the memory DMA engine and IOC DMA engine to drain data from the cache without processor intervention whenever a data buffer in the cache is filled or drained;
using a dependency table comprising a plurality of index fields, wherein each of the plurality of index fields comprises a plurality of buffer fields;
wherein the plurality of buffer fields comprises a first buffer field comprising a first plurality of sub-indices assigned to the memory DMA engine;
wherein the plurality of buffer fields comprises a second buffer field comprising a second plurality of sub-indices assigned to the IOC DMA engine;
wherein the cache comprises a first descriptor for the memory DMA engine and a second descriptor for the IOC DMA engine and wherein the first descriptor and the second descriptor point to a first data buffer in the cache.

10. The method of claim 9, wherein the memory DMA engine can start transferring data between a memory and a first buffer in the cache with one of the plurality of buffer fields having a first value;
wherein the IOC DMA engine can start transferring data between the first buffer in the cache and an IO bus interface with the one of the plurality of buffer fields having a second value.

11. The method of claim 10, wherein one of the memory DMA engine and IOC DMA engine updates the one of the plurality of buffer fields between being free and being allocated; and wherein another one of the memory DMA engine and the IOC DMA engine monitors the one of the plurality of buffer fields as being free or as being allocated.

12. The method of claim 11, wherein the memory DMA engine updates the one of the plurality of buffer fields for a read command and wherein the IOC DMA engine updates the one of the plurality of buffer fields for a write command.

13. The method of claim 12, wherein the one of the plurality of buffer fields is free in response to data being transferred to a data buffer in the cache and the data being available to be drained from the data buffer.

14. The method of claim 13, wherein the memory DMA engine can start transferring data between the memory and a second buffer in the cache with a second one of the plurality of buffer fields having the first value;
wherein the IOC DMA engine can start transferring data between the second buffer in the cache and the IO bus interface with the second one of the plurality of buffer fields having the second value.

15. The method of claim 9, further comprising:
processing data, by an intermediate processing DMA engine, from the cache.

16. The method of claim 15, wherein the intermediate processing DMA engine can start transferring data between the cache and the intermediate processing DMA engine with one of the plurality of buffer fields having a second value.

17. An article of manufacture, comprising:
a non-transient computer-readable medium having stored thereon instructions that permit a method comprising:
permitting one of a memory DMA (Direct Memory Access) engine and IOC (input/output to cache) DMA engine to transmit data to a cache and permitting, in parallel, another one of the memory DMA engine and IOC DMA engine to drain data from the cache without processor intervention whenever a data buffer in the cache is filled or drained;
wherein the method further comprises: using a dependency table comprising a plurality of index fields, wherein each of the plurality of index fields comprises a plurality of buffer fields;
wherein the plurality of buffer fields comprises a first buffer field comprising a first plurality of sub-indices assigned to the memory DMA engine;
wherein the plurality of buffer fields comprises a second buffer field comprising a second plurality of sub-indices assigned to the IOC DMA engine;
wherein the cache comprises a first descriptor for the memory DMA engine and a second descriptor for the IOC DMA engine and wherein the first descriptor and the second descriptor point to a first data buffer in the cache.

* * * * *